(12) United States Patent
Choi

(10) Patent No.: US 8,153,459 B2
(45) Date of Patent: Apr. 10, 2012

(54) ORGANIC LIGHT EMITTING DIODE DISPLAY AND FABRICATING METHOD THEREOF

(75) Inventor: Heedong Choi, Chungnam (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/852,604

(22) Filed: Aug. 9, 2010

(65) Prior Publication Data

US 2011/0003414 A1   Jan. 6, 2011

Related U.S. Application Data

(62) Division of application No. 12/318,158, filed on Dec. 22, 2008, now Pat. No. 7,786,481.

(30) Foreign Application Priority Data

Aug. 26, 2008  (KR) .......................... 10-2008-0083305
Sep. 23, 2008  (KR) .......................... 10-2008-0093424

(51) Int. Cl.
   *H01L 51/56* (2006.01)
(52) U.S. Cl. ............. 438/29; 438/34; 438/99; 438/152; 438/609; 257/E33.064; 257/E51.006; 257/E51.018
(58) Field of Classification Search .................... 438/29, 438/34, 99, 152, 609; 257/E33.064, E51.006, 257/E51.018
   See application file for complete search history.

(56) References Cited

U.S. PATENT DOCUMENTS

| | | | |
|---|---|---|---|
| 6,081,310 A | 6/2000 | Katsuya et al. | 349/113 |
| 7,335,923 B2 | 2/2008 | Kang et al. | 257/81 |
| 7,423,638 B2 | 9/2008 | Kwon | 345/206 |
| 7,544,534 B2 | 6/2009 | Lee et al. | |
| 7,612,839 B2 | 11/2009 | Hisada | |
| 2006/0006540 A1 | 1/2006 | Park et al. | 257/758 |
| 2007/0257253 A1 | 11/2007 | Im et al. | |
| 2008/0032431 A1 | 2/2008 | Hsu et al. | 438/29 |
| 2008/0197354 A1* | 8/2008 | Cho et al. | 438/155 |
| 2008/0230770 A1* | 9/2008 | Yoon et al. | 438/34 |

FOREIGN PATENT DOCUMENTS

| | | |
|---|---|---|
| CN | 1655655 | 8/2005 |
| CN | 1735294 | 2/2006 |
| CN | 101114668 | 1/2008 |
| JP | 2003-338628 | 11/2003 |
| JP | 2006-84905 | 3/2006 |
| JP | 2008-141091 | 6/2008 |
| WO | WO 2006/098176 | 9/2006 |

\* cited by examiner

*Primary Examiner* — M. Wilczewski
*Assistant Examiner* — Toniae M. Thomas
(74) *Attorney, Agent, or Firm* — Morgan, Lewis & Bockius LLP

(57) ABSTRACT

An organic light emitting diode display device includes a switch TFT and a drive TFT formed on a substrate; an overcoat layer formed on the TFTs; a drain contact hole exposing portions of a drain electrode of the drive TFT by removing portions of the overcoat layer; a first electrode contacting to the drain electrode of the drive TFT; a bank pattern exposing an aperture area of a pixel; an organic layer formed on the first electrode; and a second electrode formed on the organic layer, wherein the bank pattern blocks regions where the drain contact hole is formed.

10 Claims, 23 Drawing Sheets

ORGANIC LIGHT EMITTING DIODE DISPLAY AND FABRICATING METHOD THEREOF

The present patent application is a divisional patent application derived from the patent application Ser. No. 12/318,158 filed on Dec. 22, 2008 now U.S. Pat. No. 7,786,481, which claims the benefit of Korean Patent Application Nos. 10-2008-0083305, filed on Aug. 26, 2008, and 10-2008-0093424, filed on Sep. 23, 2008, which are incorporated herein by reference for all purposes as if fully set forth herein.

BACKGROUND OF THE INVENTION

1. Field of the Invention

The present disclosure relates to the organic light emitting diode display and the fabricating method thereof.

2. Discussion of the Related Art

Recently, various flat panel display devices are actively and widely spread to the display applications for overcoming the heavy weight and large volume of the cathode ray tube. For these flat panel display devices, there are liquid crystal display (or "LCD") device, field emission display (or "FED") device, plasma display panel (or "PDP"), electroluminescence device and so on.

The electroluminescence devices are classified into the inorganic light emitting diode display and the organic light emitting diode display, according to the material of the light emitting layer. As adapting the self-light-emitting material, the electroluminescence device has various merits such as fast response speed, excellent light emitting efficiency, high brightness and wide view angle.

The active matrix type organic light emitting diode display (or "AMOLED") represents images by controlling the electric current flowing to the organic light emitting diode (or "OLED") using thin film transistor. The organic light emitting diode display is classified into the top emission type and the bottom emission type according to the structure of the OLED including the anode electrode, the cathode electrode and the organic layer. The bottom emission type irradiates the visible light generated from the organic layer to the lower part of the substrate having TFT. In the interim, the top emission type irradiates the visible light to the upper part of the substrate having TFT.

FIG. 1 illustrates a cross-sectional structure of a pixel in the top emission type organic light emitting diode display device. FIG. 2 is a plan view illustrating the switch TFT of the FIG. 1.

Referring to FIG. 1, the OLED according to the related art comprises the data line and the gate line formed on substrate 10, switch TFT (SWTFT), drive TFT (DRTFT), storage capacitor, overcoat 18, buffer layer 19, cathode electrode 20, bank pattern 21, organic layer 22, and anode electrode 23.

On the substrate 10, the gate metal pattern is formed, including gate line, switch TFT (SWTFT) connecting to the gate line, and the gate electrodes 11a and 11b of the drive TFT (DRTFT). The gate insulating layer 12 is formed on the substrate 10 having the gate metal pattern for covering the gate metal pattern. The active layers 13a and 13b of the switch TFT (SWTFT) and the drive TFT (DRTFT) is formed on the gate insulating layer 12 by the semiconductor pattern. The source/drain metal pattern including source electrodes 14a and 14b and the drain electrodes 15a and 15b of the switch TFT (SWTFT) and the drive TFT (DRTFT) is formed on the semiconductor pattern and the gate insulating layer 12. The passivation layer 16 is formed on the source/drain metal pattern and the gate insulating layer 12. Some portion of the drain electrode 15 of the switch TFT (SWTFT) is exposed through the contact hole penetrating the passivation layer 16. In addition, some portion of the gate electrode 11b of the drive TFT (DRTFT) is exposed through the contact hole penetrating the passivation layer 16 and the gate insulating layer 12. On the passivation layer 16, the contact electrode pattern 17 made of a transparent conductive material is formed. The contact electrode pattern 17 contacts to the drain electrode of the switch TFT (SWTFT) through the contact hole penetrating the passivation layer 16, and to the gate electrode 1b of the drive TFT (DRTFT) through the contact hole penetrating the passivation layer 16 and the gate insulating layer 12 so that the switch TFT (SWTFT) and the drive TFT (DRTFT) are electrically connected. The overcoat layer 18 including the organic insulating material such as polyimide or photoacrylic is formed on the passivation layer 16 and the contact electrode pattern 17. Some portion of the drain electrode 15b of the drive TFT (DRTFT) is exposed through the drain contact hole (DH) penetrating the overcoat layer 18. On the overcoat layer 18, the buffer layer 19 made of silicon nitride (SiNx) is formed. On the some portion of the buffer layer 19 and the exposed drain electrode 15b of the drive TFT (DRTFT), the cathode electrode 20 made of aluminum (Al) is formed. The bank pattern 21 including inorganic material such as silicon nitride (SiNx) is formed on some portion of the cathode electrode 20 and the buffer layer 19 to design the aperture area (EA) of pixel. On the bank pattern 21 and the cathode electrode 20, the organic layer 22 and the anode electrode 23 including ITO (indium tin oxide) are formed sequentially. The anode electrode 23 is supplied with a high voltage.

In the OLED as shown in FIG. 1, the drain contact hole (DH) penetrating the overcoat layer 18 having uniform thickness is formed within the aperture area (EA). Therefore, the thickness of the organic layer 22 within the aperture area (EA) has not uniform thickness because the area (A) of drain contact hole (DH) has thinner organic layer 22 than other areas due to the step shape of the drain contact hole (DH). Generally, the brightness of the pixel is reversely proportional to the thickness of the organic layer per unit area. Therefore, the brightness of one pixel can be varied according to the position. That is, the brightness at the area (A) of the drain contact hole (DH) is higher than other areas. Like this, if the brightness of some area (A) in one pixel is high, the organic layer of the area (A) can easily be degraded due to the stress focused thereon. If some area portion (A) of the organic layer in one aperture area (EA) is degraded, this portion is acknowledged as an error point of brightness. Due to this fault of organic layer around the drain contact hole (DH), the OLED according to the related art has inferior image quality and short life time of the display panel.

When the TFTs are formed with the n type semiconductor layer in the OLED shown in FIG. 1, the semiconductor layer of the TFT includes the silicon layer and the n+ ion-dopped layer on the silicon layer. The n+ ion-dopped layer plays role of ohmic contact between the silicon layer and the metal layer thereon. The n+ ion-dopped layer should be removed on the channel layer using the dry etching method. At designing the TFT, if the semiconductor layer 13a is misaligned with the gate electrode 11a with amount "B" based on the edges of the channel as shown in FIG. 2, then the semiconductor layer 13a has the step difference at the misaligned portion (B) as shown in FIG. 1 In this case, the n+ ion-dopped layer of the semiconductor layer 13a at this stepped portion cannot be easily removed unlike other plane portions. If the n+ ion-dopped layer is not properly removed at the channel of TFT, an unwanted leakage current may be occurred at the off level of TFT.

FIG. 3 is the graph illustrating the TFT leakage current amount at the Off-level due to the residual n+ ion-dopped layer at the channel portion. As shown in FIG. 3, the maximum TFT leakage current amount at the Off-level due to the residual n+ ion-dopped layer at the channel portion according to a plurality experiment result is about $1 \times 10^{-9}$ A. It is very large electric current. Like this, when the TFT leakage current amount is so high, the voltage keeping performance of the storage capacitor may be lowered. It causes the defects on display quality such as flicker or lowered contrast ratio due to degraded black gray-scale characteristics.

SUMMARY OF THE INVENTION

One purpose of the present disclosure is for providing the organic light emitting diode display device and the fabricating method of the OLED enhancing the life time of the OLED panel by forming a drain contact hole so that the drain contact hole cannot be formed in an aperture area.

Another purpose of the present disclosure is for providing the organic light emitting diode display device and the fabricating method of the OLED improving the display quality by reducing the leakage current where the channel of the TFT is formed.

To accomplish the above purposes, An organic light emitting diode display device includes a switch TFT and a drive TFT formed on a substrate; an overcoat layer formed on the TFTs; a drain contact hole exposing portions of a drain electrode of the drive TFT by removing portions of the overcoat layer; a first electrode contacting to the drain electrode of the drive TFT; a bank pattern exposing an aperture area of a pixel; an organic layer formed on the first electrode; and a second electrode formed on the organic layer, wherein the bank pattern blocks regions where the drain contact hole is formed.

The switch TFT comprises: a gate electrode connecting to a gate line; and a first active pattern for forming a first channel between a source electrode and a drain electrode; wherein an edge of the first active pattern is located inner side from an edge of the gate electrode of the switch TFT.

The first channel includes at least selected one of a U-shape, an L-shape, and an I-shape.

The drive TFT comprises: a gate electrode connecting to a drain electrode of the switch TFT; and a second active pattern for forming a second channel between a source electrode and a drain electrode; wherein an edge of the second active pattern is located inner side from an outermost edge of the gate electrode of the drive TFT.

The second channel includes an "O"-shape.

The bank pattern includes at least selected one of an inorganic material and an organic material.

The bank pattern includes selected one of a silicon oxide, a silicon nitride, a photoacryl, and a polyimide.

The first electrode includes an opaque cathode electrode, and the second electrode includes a transparent anode electrode.

The first electrode includes an anode electrode having a reflection electrode, and the second electrode includes a transparent cathode electrode.

The first electrode includes selected one of a triple-layer structure having two transparent metals and a reflection metal therebetween, and a double-layer structure having a transparent metal and a reflection metal.

The fabricating method of the organic light emitting diode display device according to the preferred embodiments of the present disclosure comprises: forming a switch TFT and a drive TFT on a substrate; forming an overcoat layer on the TFTs; forming a drain contact hole exposing some portions of a drain electrode of the drive TFT by removing some portions of the overcoat layer; patterning a first electrode for connecting to the drain electrode of the drive TFT; patterning a bank pattern exposing an aperture area of a pixel; forming an organic layer on the first electrode; forming a second electrode on the organic layer, and wherein the bank pattern blocks regions where the drain contact hole is formed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 18b is a cross-sectional view cutting along III-III' line in the FIG. 18a.

FIG. 19b is a cross-sectional view cutting along IV-IV' line in the FIG. 19a.

DETAILED DESCRIPTION OF PREFERRED EMBODIMENTS

Figure 1:
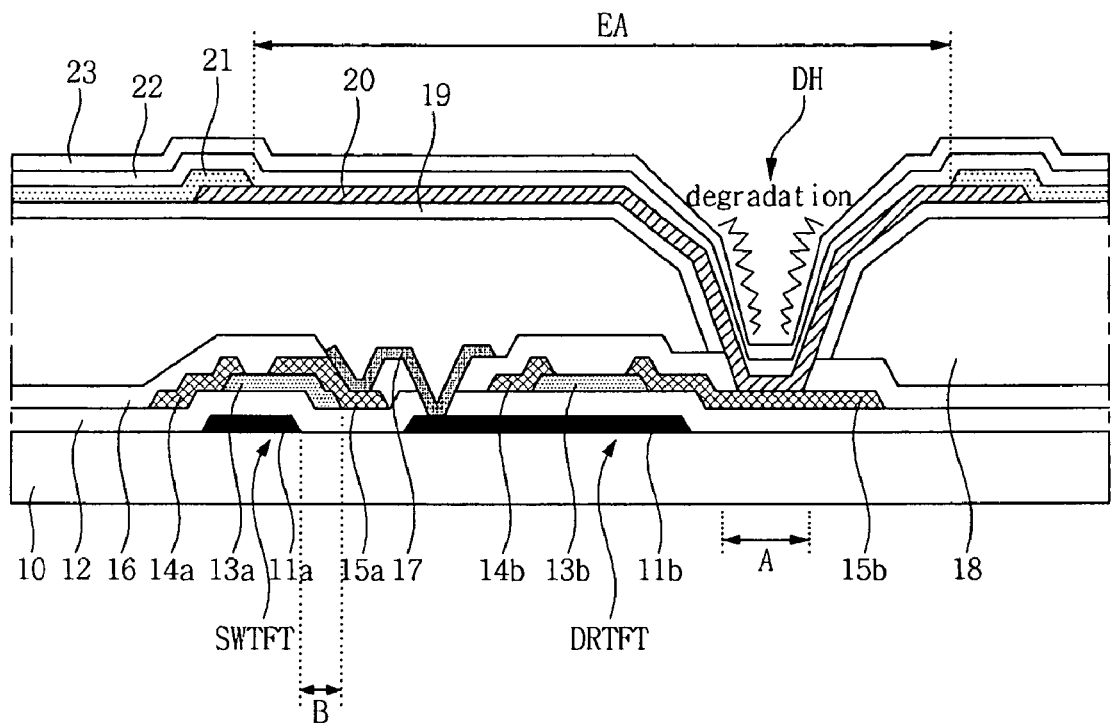
FIG. 1 is the drawing illustrating the cross-section of a pixel in the organic light emitting diode display device according to the related art.
Figure 2:
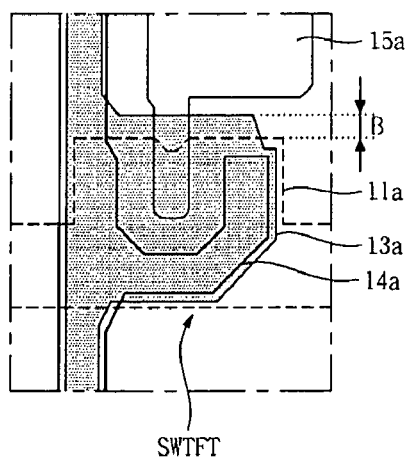
FIG. 2 is a plane view illustrating the switch TFT of the FIG. 1.
Figure 3:
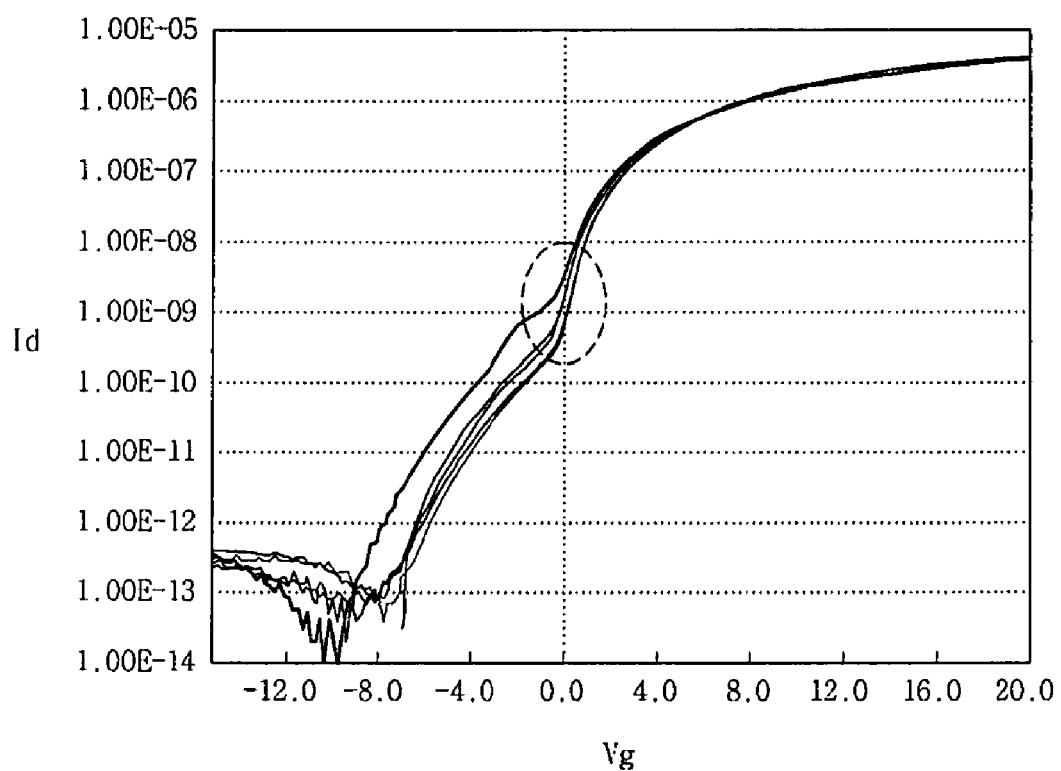
FIG. 3 is a graph illustrating the TFT leakage current amount at the Off-level due to the residual n+ ion-dopped layer where the channel is formed.
Figure 4:
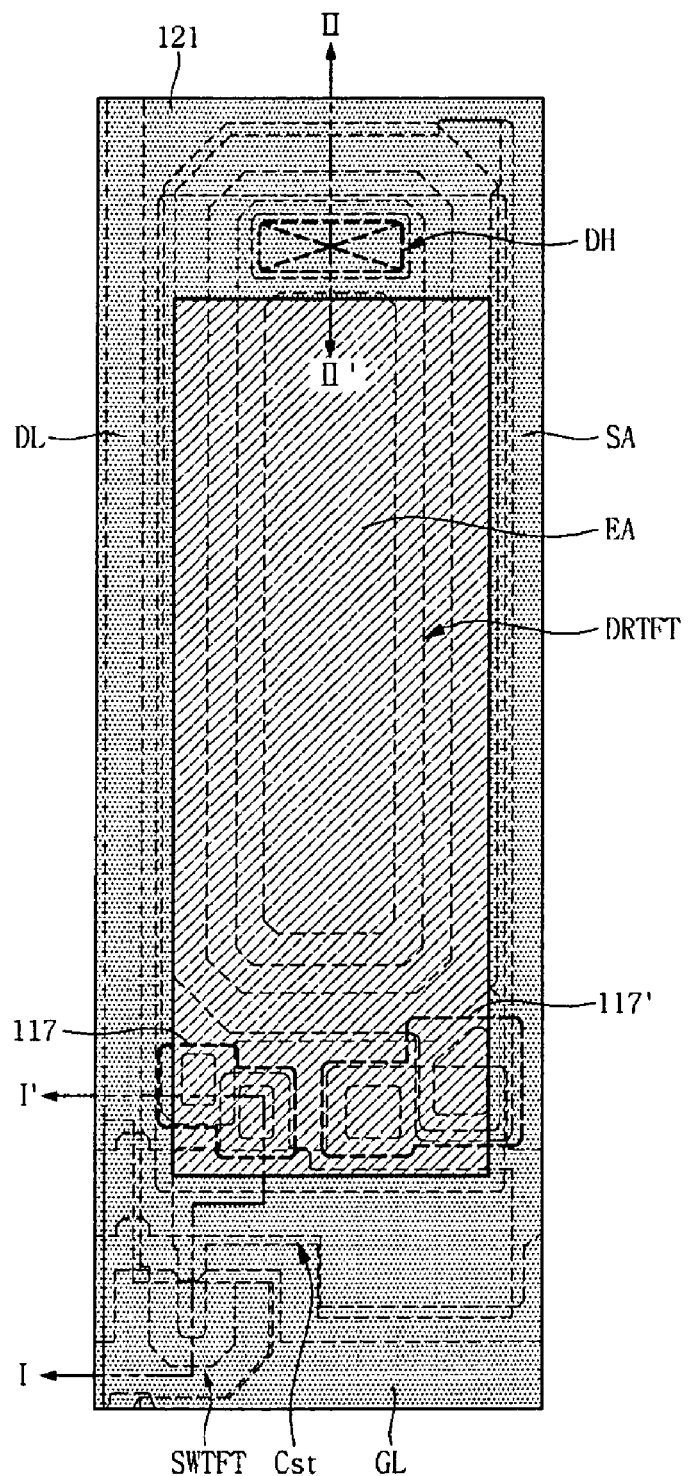
FIG. 4 is a diagram illustrating the plane structure of a pixel in the OLED display device according to the first embodiment of the present disclosure.
Figure 21:
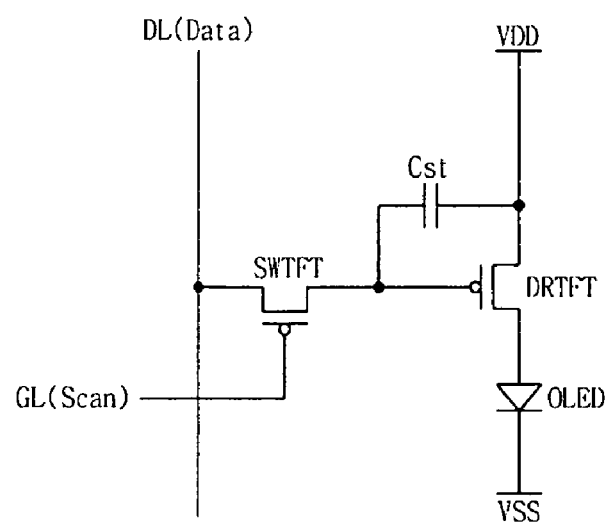
FIG. 21 is a diagram illustrating the equivalent circuit of a pixel of the OLED display device shown in the FIG. 20.

Referring to FIGS. 4 and 21, preferred embodiments of the present disclosure will be described in detail.

FIGS. 4 to 19b illustrate the inverted OLED structure in which the upper electrode is the anode electrode and the lower electrode is the cathode electrode.

Figure 5:
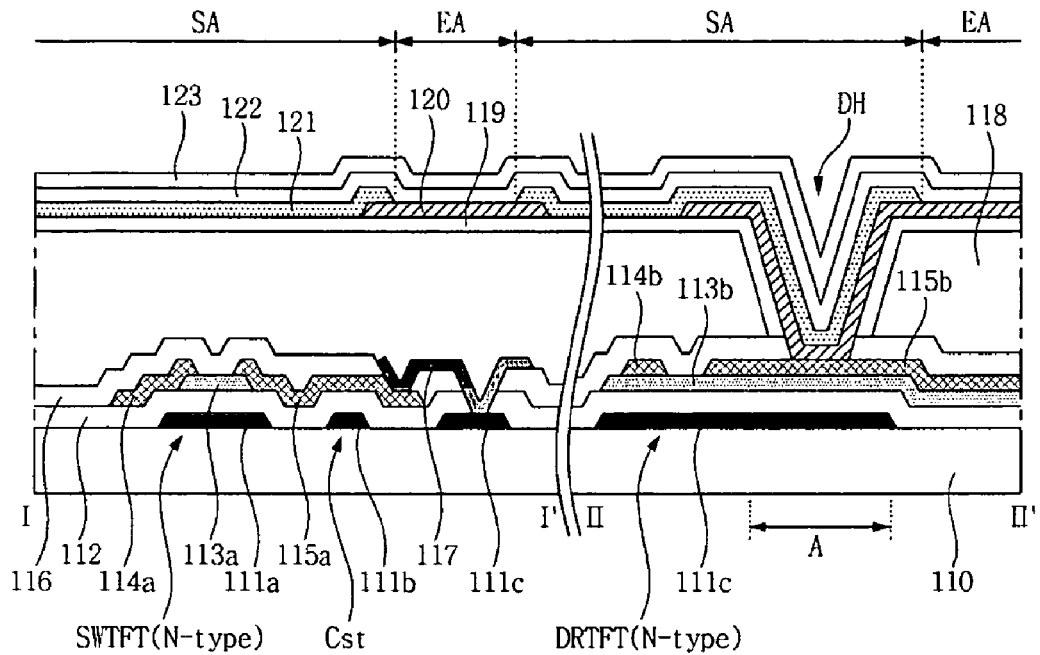
FIG. 5 is a diagram illustrating the cross-sectional structure cutting along I-I' line and II-II' line in the FIG. 4.
Figure 6:
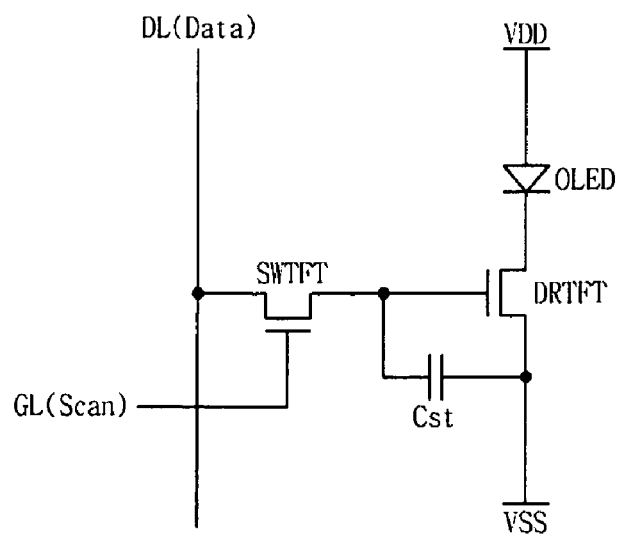
FIG. 6 is a diagram illustrating the equivalent circuit diagram of a pixel in the OLED display device shown in the FIGS. 4 and 5.

FIG. 4 illustrates the plane structure of a pixel in the OLED display device according to the first embodiment of the present disclosure. FIG. 5 illustrates the cross-sectional structures cutting alone I-I' line and II-II' line in FIG. 4. And, FIG. 6 illustrates the equivalent circuit diagram of a pixel in the OLED display device shown in FIG. 5. In FIGS. 4 and 5, the gate pad, the data pad, VDD supply pad and VSS supply pad are not shown, in convenience.

Referring to FIGS. 4 to 6, the OLED display device according to the first embodiment of the present disclosure comprises the gate line (GL), the data line (DL), VSS supply line 111n, switch TFT (SWTFT), drive TFT (DRTFT), storage capacitor (Cst), overcoat layer 118, buffer layer 119, bank pattern 121, and organic light emitting diode (or "OLED") formed on a substrate 110. The OLED includes the cathode electrode 120, the organic layer 122, and the anode electrode 123.

The gate line (GL) is connected to the gate driver through the gate pad so that the scan pulse (Scan) is supplied from the gate driver to one electrode of the switch TFT (SWTFT). The data line (DL) is connected to the data driver through the data pad so that the data is supplied from the data driver to the switch TFT (SWTFT). The VSS supply line 111b is connected to the VSS supply pad so that the low level voltage (VSS) is supplied from the VSS power source to one electrode of the drive TFT (DRTFT).

The source electrode 114a of the switch TFT (SWTFT) is connected to the data line (DL), and the drain electrode 115a of the switch TFT (SWTFT) is connected to the gate electrode 111c of the drive TFT (DRTFT) through the first contact electrode pattern 117. The gate electrode 111a of the switch TFT (SWTFT) is connected to the gate line (GL) supplied with the scan pulse (Scan) sequentially. The switch TFT (SWTFT) turns on in response to the scan pulse (Scan) from the gate line (GL) so that it can supply the data from the data line (DL) to the gate electrode 111c of the drive TFT (DRTFT). The switch TFT (SWTFT) may be equipped with the N-type metal-oxide semiconductor field effect transistor (or "MOSFET"). The edge of the active pattern in the switch TFT (SWTFT) is located inside of the edge of gate metal pattern including gate electrode 111a so that the leakage current at the channel portion can be reduced.

The source electrode 114b of the drive TFT (DRTFT) is connected to the VSS supply line 111b through the second contact electrode pattern 117', and the drain electrode 115b of the drive TFT (DRTFT) is connected to the cathode electrode 120. One edge of the gate electrode 111c of the drive TFT (DRTFT) contacts to the drain electrode 115a of the switch TFT (SWTFT). The drive TFT (DRTFT) controls the electric current amount flowing through the OLED based on the data supplied to the gate electrode 111 c of itself. The drive TFT (DRTFT) may be equipped with the N-type MOSFET. The edge of the active pattern in the drive TFT (DRTFT) is located inside of the edge of the gate metal pattern including gate electrode 111c so that the leakage current at the channel portion can be reduced.

The storage capacitor (Cst) comprises the VSS supply line 111b as the one electrode, the drain electrode 115a of the switch TFT (SWTFT) as the other electrode, and the gate insulating layer 112 as the dielectric layer between the two electrodes. The storage capacitor (Cst) keeps the electric voltage difference between the gate electrode 111c and the source electrode 114b of the drive TFT (DRTFT) constantly within one frame.

The overcoat layer 118 is formed on the TFTs (SWTFT and DRTFT) with an organic material such as polyimide or photoacryl to reduce the step difference caused by the TFTs (SWTFT and DRTFT). Some portion of the drain electrode 115b in the drive TFT (DRTFT) is exposed through the drain contact hole (DH) penetrating the overcoat 118. The cathode electrode 120 playing role of lower electrode of OLED is connected to the exposed drain electrode 115b of the drive TFT (DRTFT). Between the overcoat layer 118 and the cathode electrode 120, there is the buffer layer 119 to block the out-gasing from the organic overcoat layer 118.

The bank pattern 121 is disposed on the buffer layer 119 and some portions of the cathode electrode 120 to define the aperture area (EA) and the non-aperture area (SA) of the pixel. The bank pattern 121 exposes the aperture area (EA) and covers the non-aperture area (SA). Especially, in the upper side of the pixel, the bank pattern 121 is formed wider than that of related art to cover the stepped area (A) caused by the drain contact hole (DH). Therefore, the stepped area (A) due to the drain contact hole (DH) is excluded from the aperture area (EA) so that the degraded quality of display due to the defected organic layer 22 at the stepped area (A) does not occur.

The organic layer 122 includes hole injection layer (or "HIL"), hole transport layer (or "HTL"), emission layer (or "EML"), electron transport layer (or "ETL") and electron injection layer (or "EIL"), and is formed on the bank pattern 121 and the cathode electrode 120. On the organic layer 122, the anode electrode 123 made of the indium tin oxide (or "ITO") is disposed. To the anode electrode 123 playing role of upper electrode of the OLED, the high level voltage (VDD) is supplied from the VDD supply pad. When the driving voltage is supplied to the anode electrode 123 and the cathode electrode 120, the hole passing through the hole transport layer (HTL) and the electron passing through the electron transport layer (ETL) move to the emission layer (EML) to form the excitator. As a result, the emitting layer (EML) irradiates the visible light.

The OLED display device is fabricated through a plurality of processing steps shown in the FIGS. 7a to 16.

FIGS. 7a, 8a, 9a, 10a, 11a, 12a, 13a, 14a and 15a are the plane views illustrating the steps of fabricating method of the OLED shown in the FIGS. 4 to 6. FIGS. 7b, 8b, 9b, 10b, 11b, 12b, 13b, 14b, 15b and 16 are the cross-sectional views illustrating the steps of fabricating method of the OLED shown in the FIGS. 4 to 6.

Figure 7A:
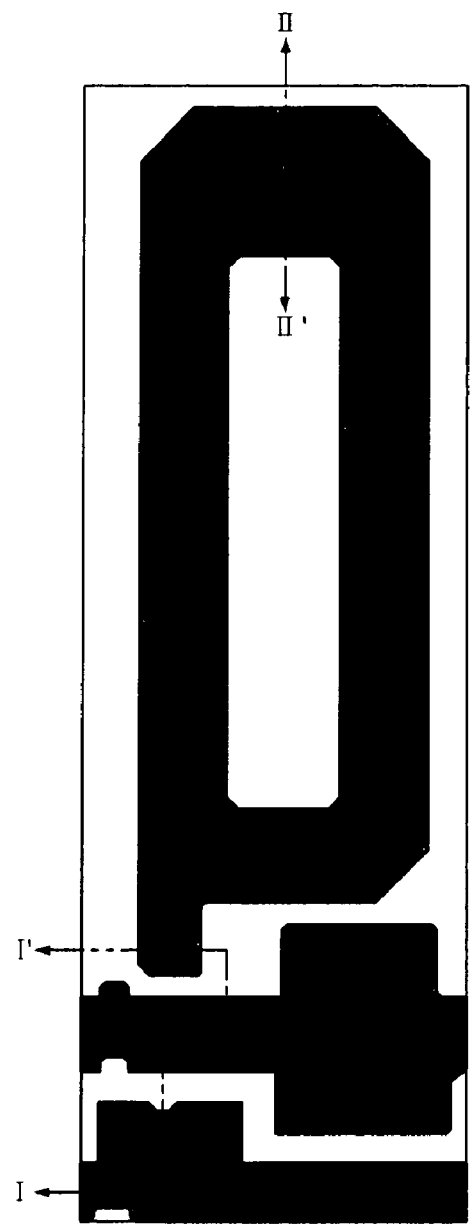
FIGS. 7a, 8a, 9a, 10a, 11a, 12a, 13a, 14a and 15a are the plane views illustrating the fabricating steps of OLED display device shown in FIGS. 4 to 6.
Figure 7B:
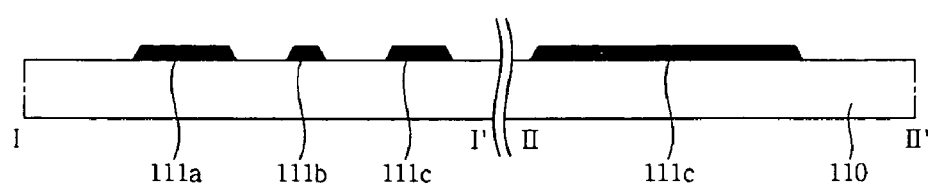
FIGS. 7b, 8b, 9b, 10b, 11b, 12b, 13b, 14b, 15b and 16 are the cross-sectional views illustrating the fabricating steps of OLED display device shown in FIGS. 4 to 6.

Referring to FIGS. 7a and 7b, on a substrate 110 including transparent glass or plastic material, a gate metal layer including any one of aluminum, aluminum neodium and molibdenium, stacked layer of two or more of them, or alloy metal having two or more of them is deposited by the sputtering process. The gate metal layer is patterned by the photo-lithograph process and the wet etching process. As a result, on the substrate 110, the gate metal pattern including the gate electrodes 111a and 111c of the switch TFT (SWTFT) and the drive TFT (DRTFT), the gate line (GL) connected to the gate electrode 111a, and the VSS supply line 111b is formed.

Figure 8A:
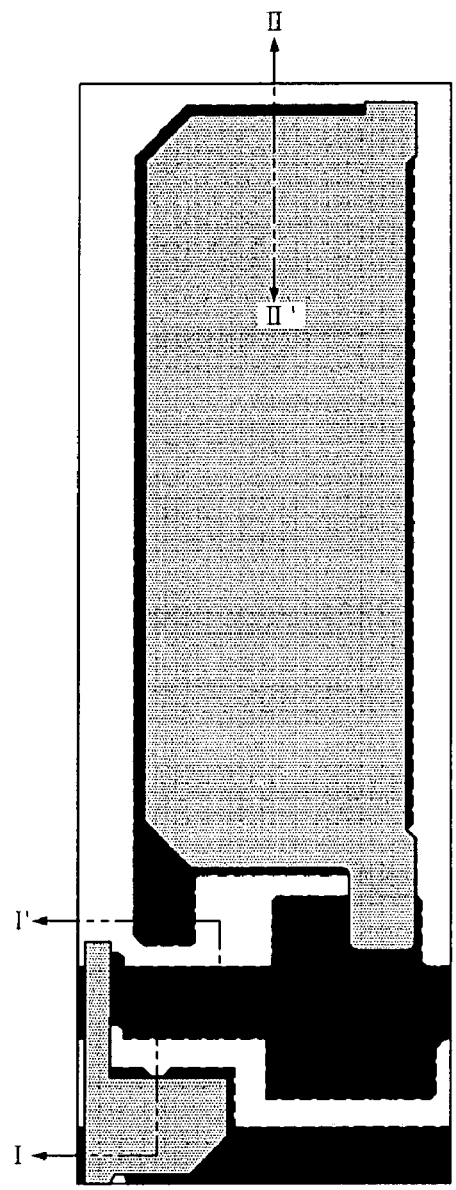
Figure 8B:
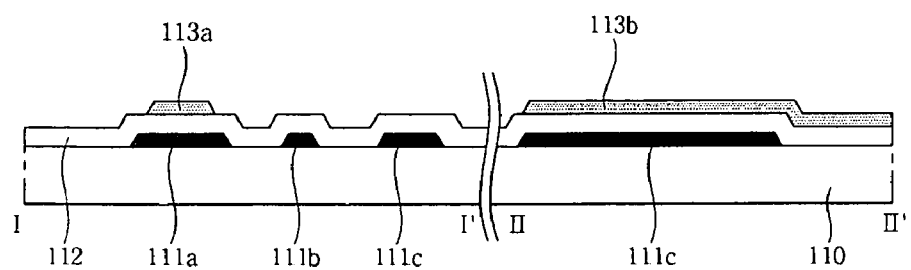
Figure 17:
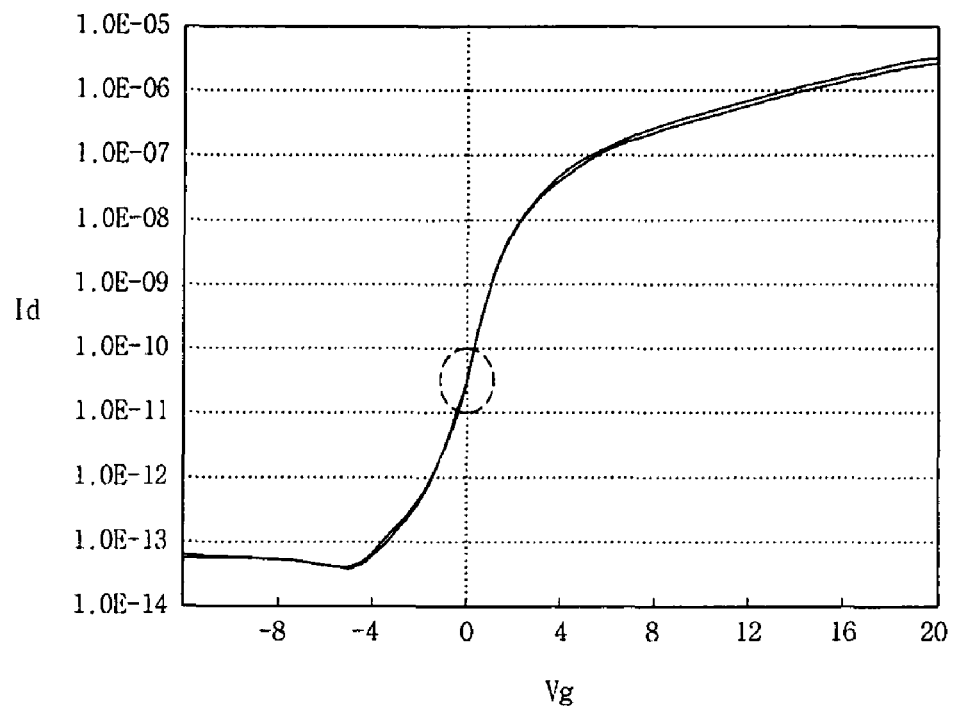
FIG. 17 is a graph illustrating the TFT leakage current amount at the Off-level according to the present disclosure.

Referring to FIGS. 8a and 8b, on the substrate 110 having the gate metal pattern, the inorganic insulating material such as silicon oxide (SiOx) or silicon nitride (SiNx) and the semiconductor material such as amorphous silicon or poly silicon including n+ ion-dopped layer are sequentially deposited by the chemical vapor deposition (or "CVD") process. After that, using the photo-lithograph process and the dry etching process, the n+ ion-dopped layer on the U-shaped channel region of the switch TFT (SWTFT) and the "O"-shaped channel region of the drive TFT (DRTFT) are removed. Then, using the remained semiconductor layer as a mask, the dry etching process is performed to remove the exposed inorganic material. As a result, the gate insulating layer 112 covering the gate metal pattern 111a, 111b, 111c and GL, the first active pattern 113a on the gate insulating layer 112, and the second active pattern 13b are formed on the substrate 110. Here, the first active pattern 113a is located inner side from the edge of the gate electrode 111a of the switch TFT (SWTFT) so that there is no step difference at the U-shaped channel region. Therefore, the n+ ion-dopped layer corresponding to the channel region is completely removed in the dry etching process. The second active pattern 113b is located inner side from the outermost edge of the gate electrode 11c in the drive TFT (DRTFT) so that there is no step difference at the "O"-shaped channel region. Therefore, the n+ ion-dopped layer corresponding to the channel region is completely removed in the dry etching process. As a result, the maximum leakage current of the Off-level of the TFT is about 5×10-12 A as shown in FIG. 17. The horizontal axis, in the FIG. 17, represents the voltage supplied to the gate electrode (VG) and the vertical axis represents the leakage current amount (ID). As shown in the graph, the leakage current amount is much less than $1 \times 10^{-9}$ A which is the leakage current amount caused by the residual n+ ion-dopped layer in the related channel region. When the leakage current amount at Off-level of the switch TFT (SWTFT) is reduced, the voltage keeping performance of the storage capacitor is enhanced so that the defected display quality problem does not occur. Furthermore, when the leakage current amount at the Off-level of the drive TFT (DRTFT) is reduced, the characteristics of the black grayscale is improved so that the contrast ratio will be enhanced.

Figure 18A:
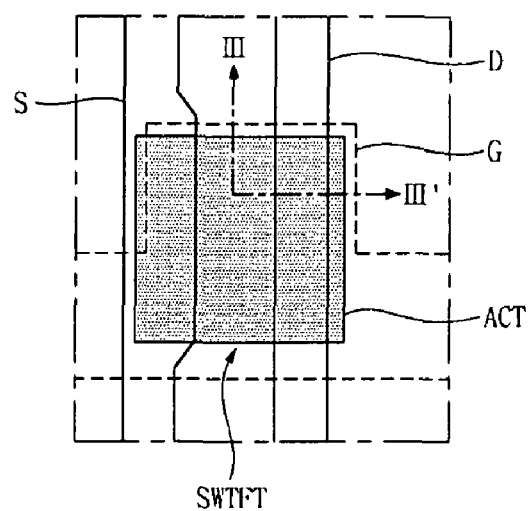
FIG. 18a is a plane view illustrating the switch TFT having I shaped channel.
Figure 18B:
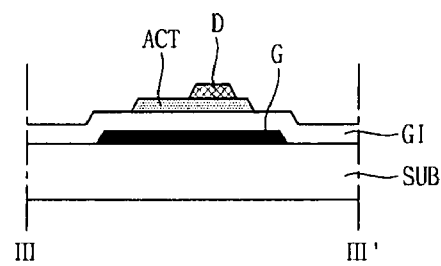
Figure 19A:
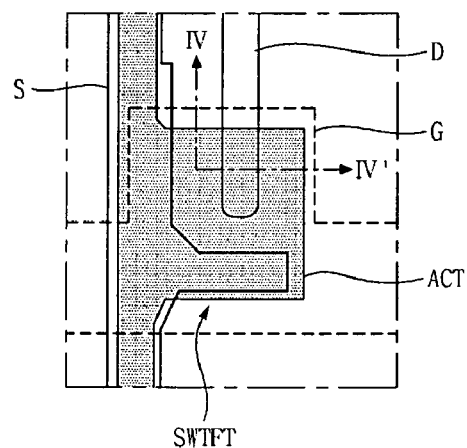
FIG. 19a is a plane view illustrating the switch TFT having L shaped channel.
Figure 19B:
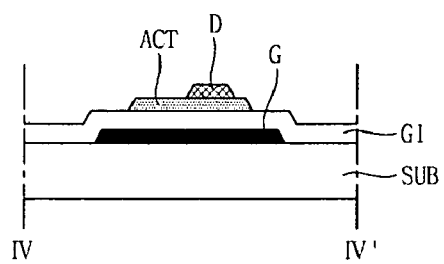

The switch TFT (SWTFT) may have I-shaped channel as shown in FIGS. 18a and 18b or L-shaped channel as shown in FIGS. 19a and 19b. In the FIGS. 18a and 18b; the active pattern (ACT) is located inner side from the edge of the gate electrode (G) comprising of the switch TFT (SWTFT) so that there is no step difference at the I-shaped channel region. Therefore, the n+ ion-dopped layer corresponding to the channel region can be completely removed. Furthermore, in the FIGS. 19a and 19b, the active pattern (ACT) is located inner side from the edge of the gate electrode (G) comprising of the switch TFT (SWTFT) so that there is no step difference at the L-shaped channel region. Therefore, the n+ ion-dopped layer corresponding to the channel region can be completely removed.

Figure 9A:
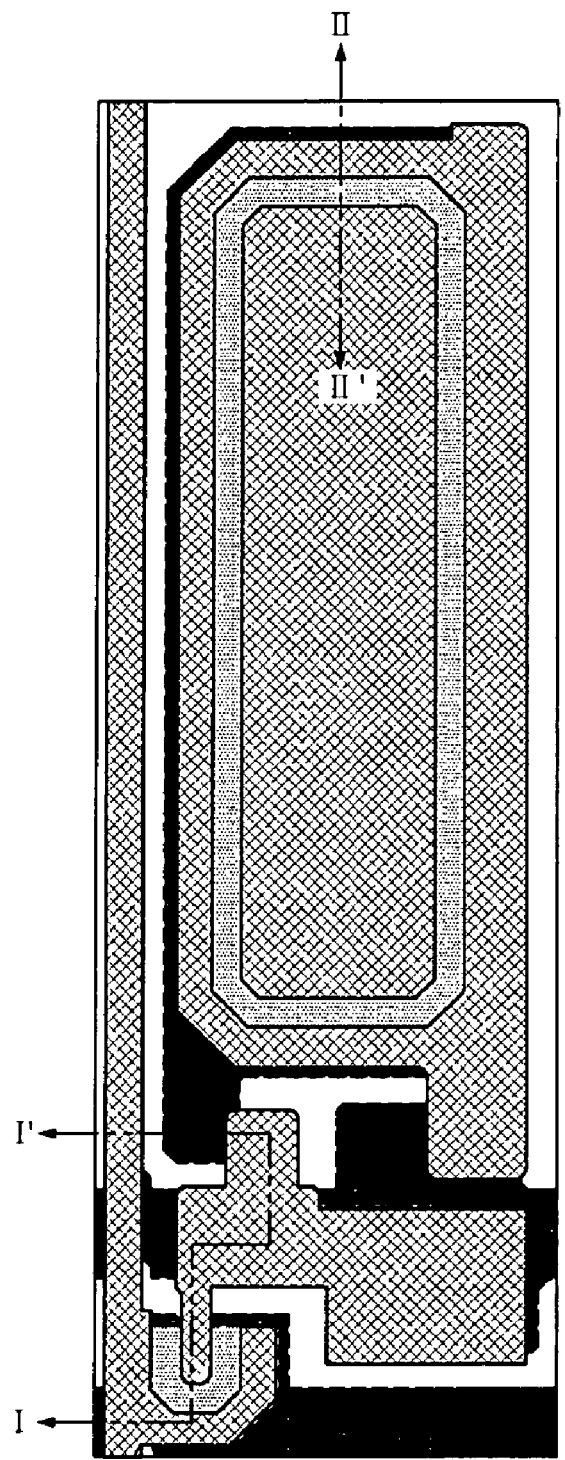
Figure 9B:
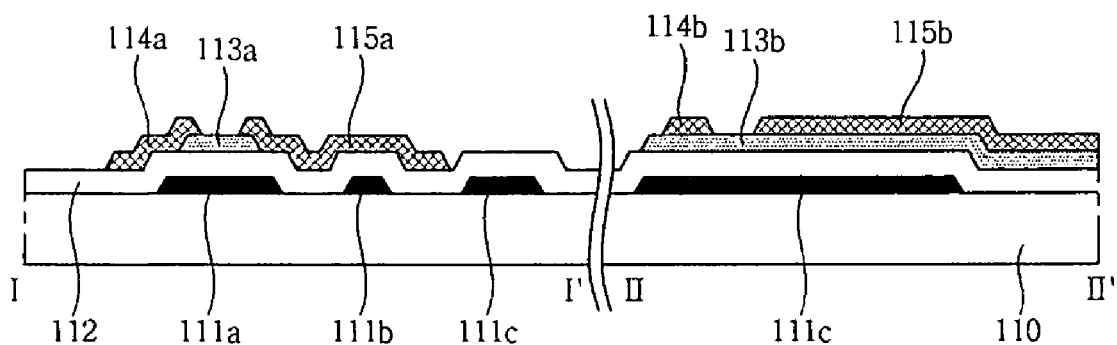

Referring to FIGS. 9a and 9b, the data metal of single or double layer including aluminum (Al), molibdenum (Mo), chromium (Cr), copper (Cu), Al-alloy, Mo-alloy, and Cu-alloy is deposited on the overall surface of the substrate 110 having the active patterns 113a and 113b. After that, the data metal is patterned by the photo-lithograph and the wet etching processes. As a result, on the substrate 110, the data metal pattern including the source electrode 114a and the drain electrode 115a of the switch TFT (SWTFT), the source electrode 114b and the drain electrode 115b of the drive TFT (DRTFT) is formed.

Figure 10A:
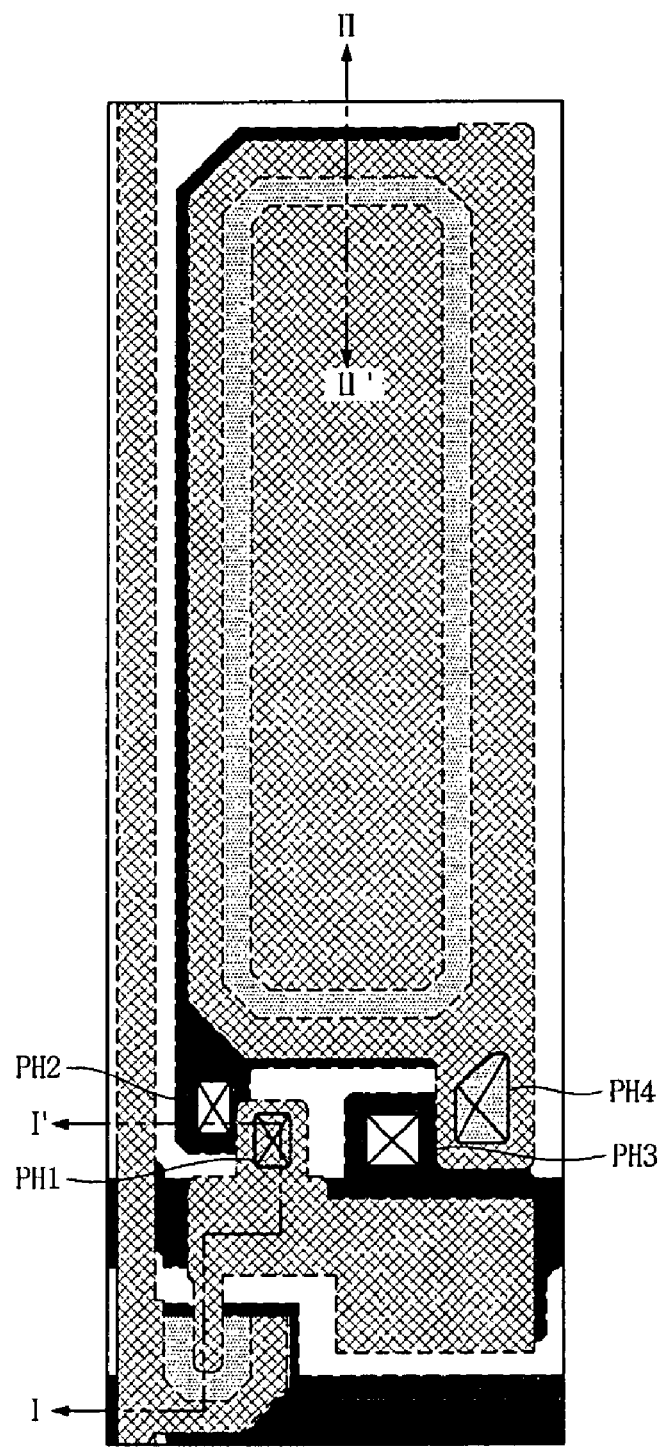
Figure 10B:
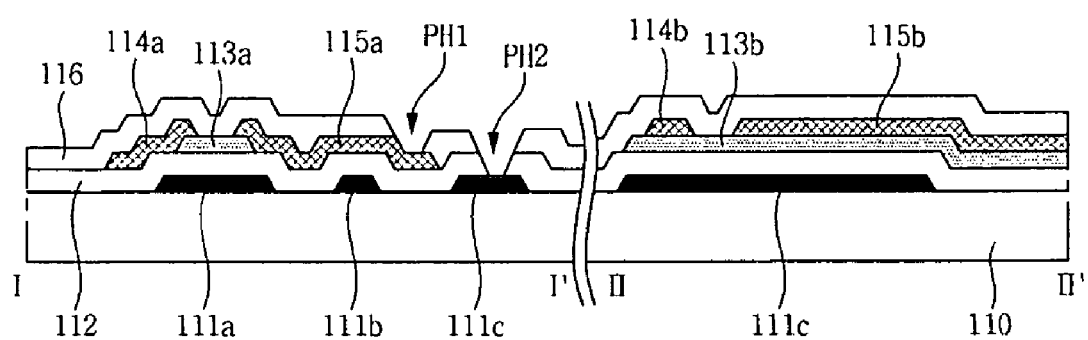

Referring to FIGS. 10a and 10b, the inorganic material such as silicon oxide (SiOx) or silicon nitride (SiNx) is deposited on the overall surface of the substrate 110 having the data metal pattern by the CVD process. After that, the inorganic, material is partially removed by the photo-lithograph and the dry etching processes. As a result, formed are the first passi hole (PH1) exposing some portions of the drain electrode 115a of the switch TFT (SWTFT), the second passi hole (PH2) exposing some portions of the gate electrode 111c of the drive TFT (DRTFT), the third passi hole (PH3) exposing some portions of the VSS supply line 111b, and the fourth passi hole (PH4) exposing some portions of the source electrode 114b of the drive TFT (DRTFT).

Figure 11A:
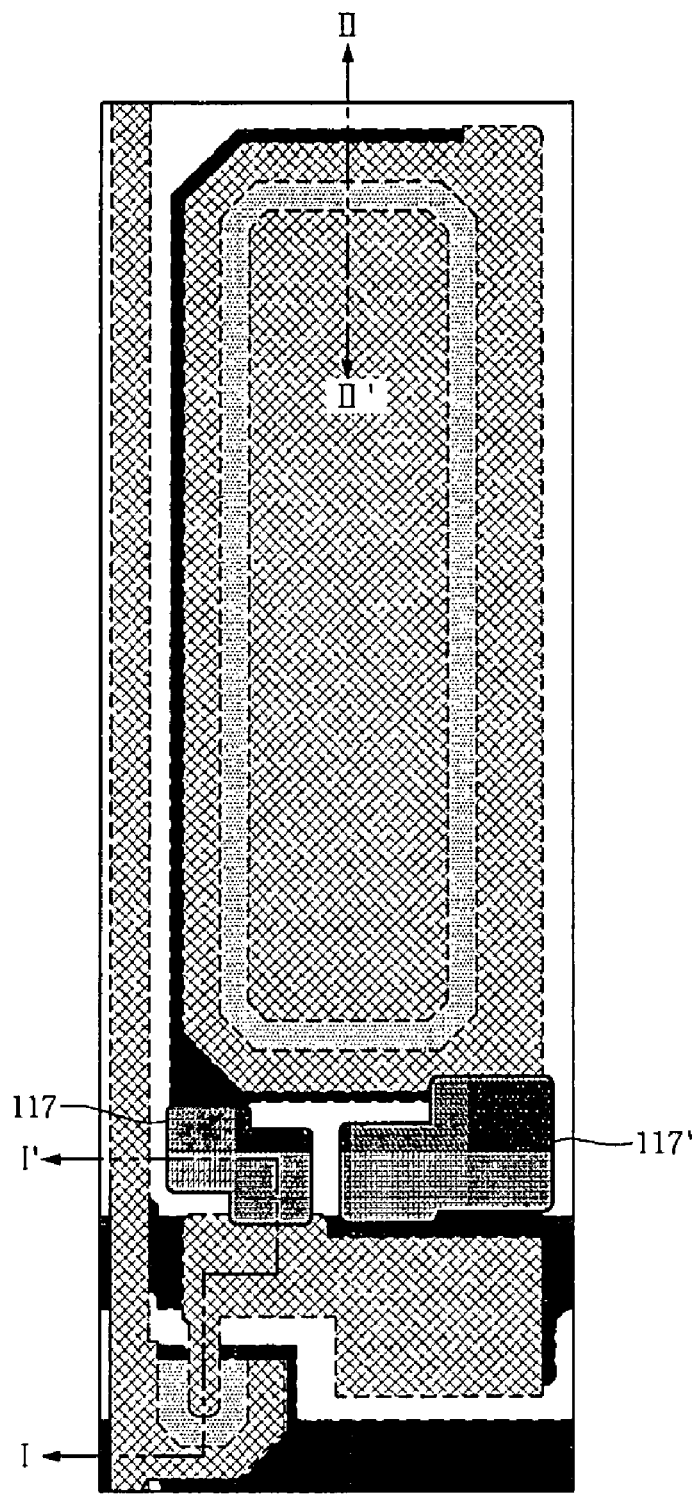
Figure 11B:
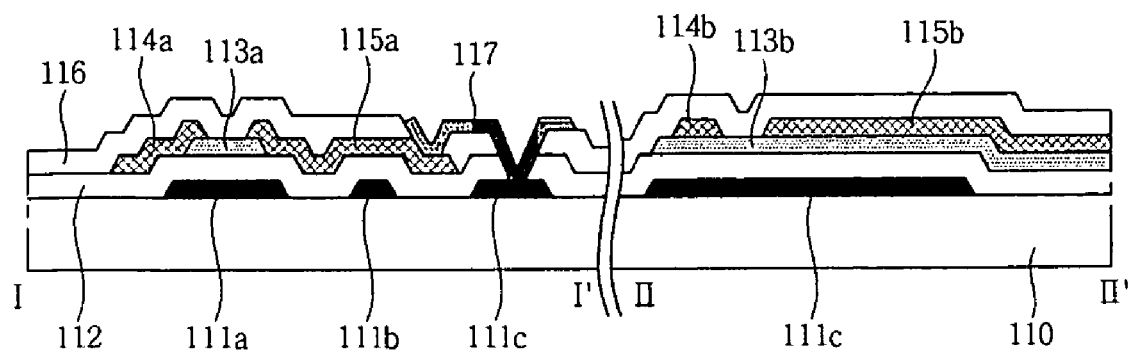

Referring to FIGS. 11a and 11b, the transparent conductive material such as ITO (indium thin oxide) or IZO (indium zinc oxide) is deposited on the overall surface of the substrate 110 having the passivation layer 116. Using the photo-lithograph and the dry etching processes, the transparent conductive material is partially removed. As a result, formed is the first contact electrode pattern 117 electrically connecting the drain electrode 115a of the switch TFT (SWTFT) to the gate electrode 111c of the drive TFT (DRTFT) and the second contact electrode pattern 117' electrically connecting the VSS supply line 11 1b to the source electrode 114b of the drive TFT (DRTFT).

Figure 12A:
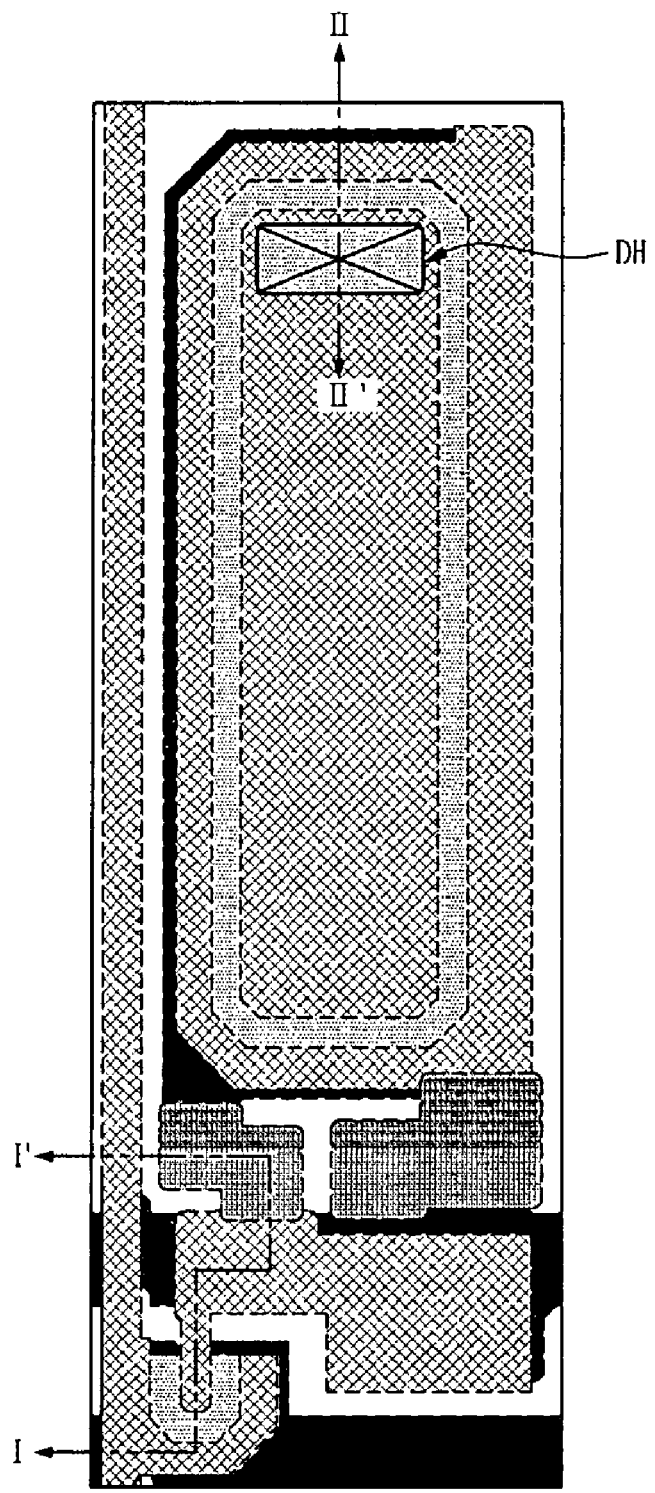
Figure 12B:
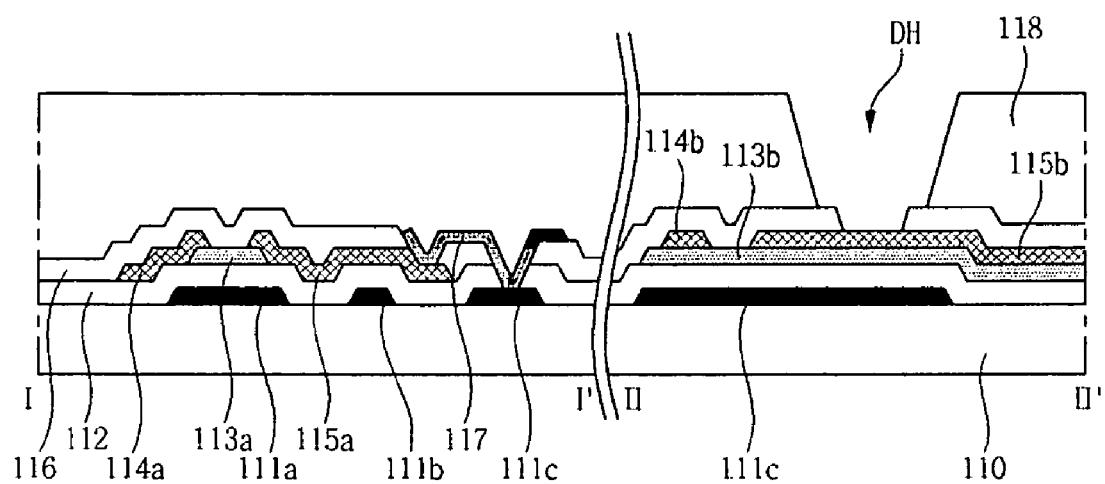

Referring to FIGS. 12a and 12b, an organic insulating material such as polyimide or photoacryl is deposited on the overall surface of the substrate 110 having the contact electrode patterns 117 and 117' by the CVD process. After that, using the photo-lithograph and the dry etching processes, the organic insulating layer is partially removed. As a result, the overcoat layer 118 having the drain contact hole (DH) exposing some portions of the passivation layer 116 formed on the drain electrode 115b of the drive TFT (DRTFT) and the drain electrode 115b of the switch TFT (SWTFT) is formed.

Figure 13A:
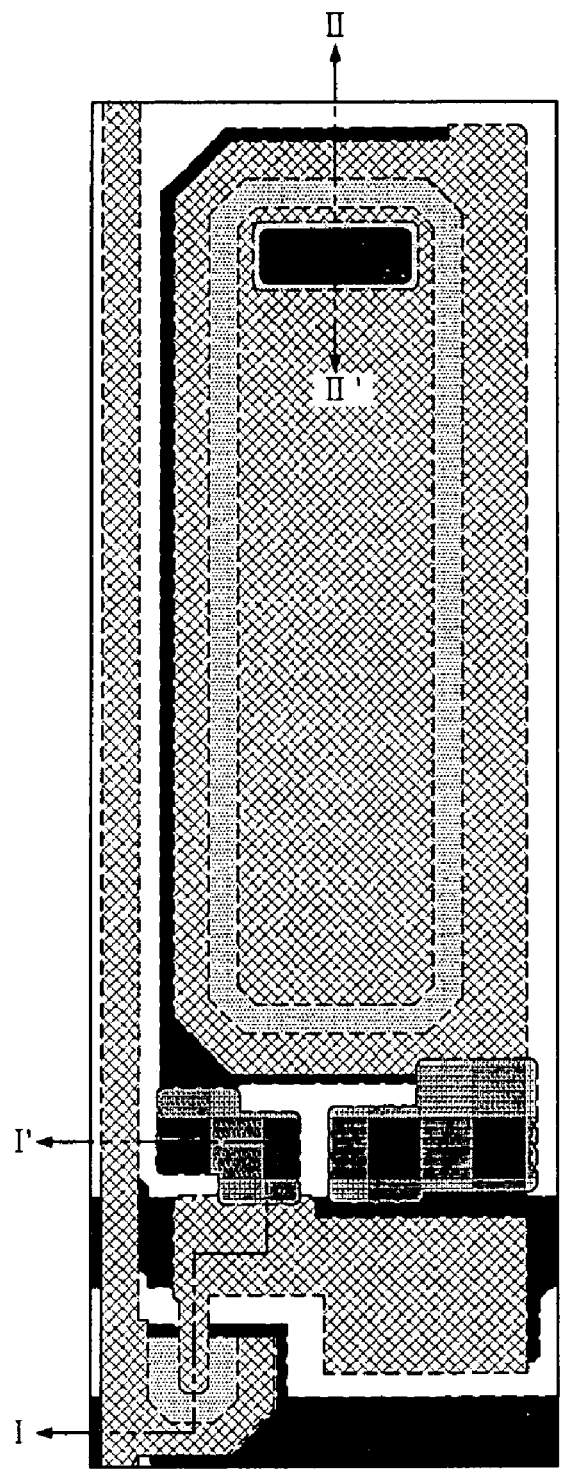
Figure 13B:
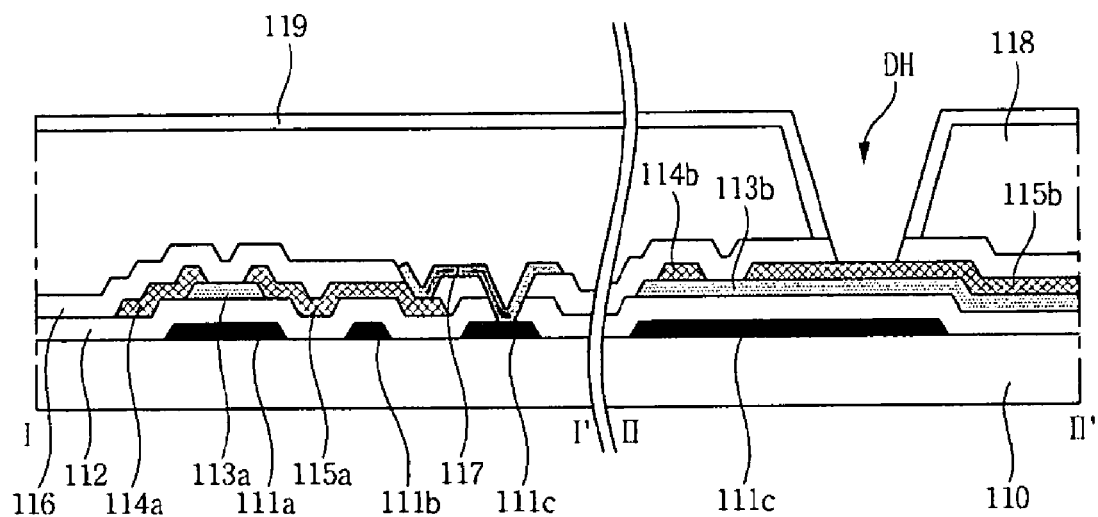

Referring to FIGS. 13a and 13b, an inorganic insulating material such as silicon oxide (SiOx) or silicon nitride (SiNx) is deposited on the overall surface of the substrate 110 having the overcoat layer 118 by CVD process. After that, using the photo-lithograph and the dry etching processes, the inorganic insulating material is partially removed. As a result, the buffer layer 119 is patterned to be formed on the overcoat layer 118 and exposes some portions of the drain electrode 115b through the drain contact hole (DH).

Figure 14A:
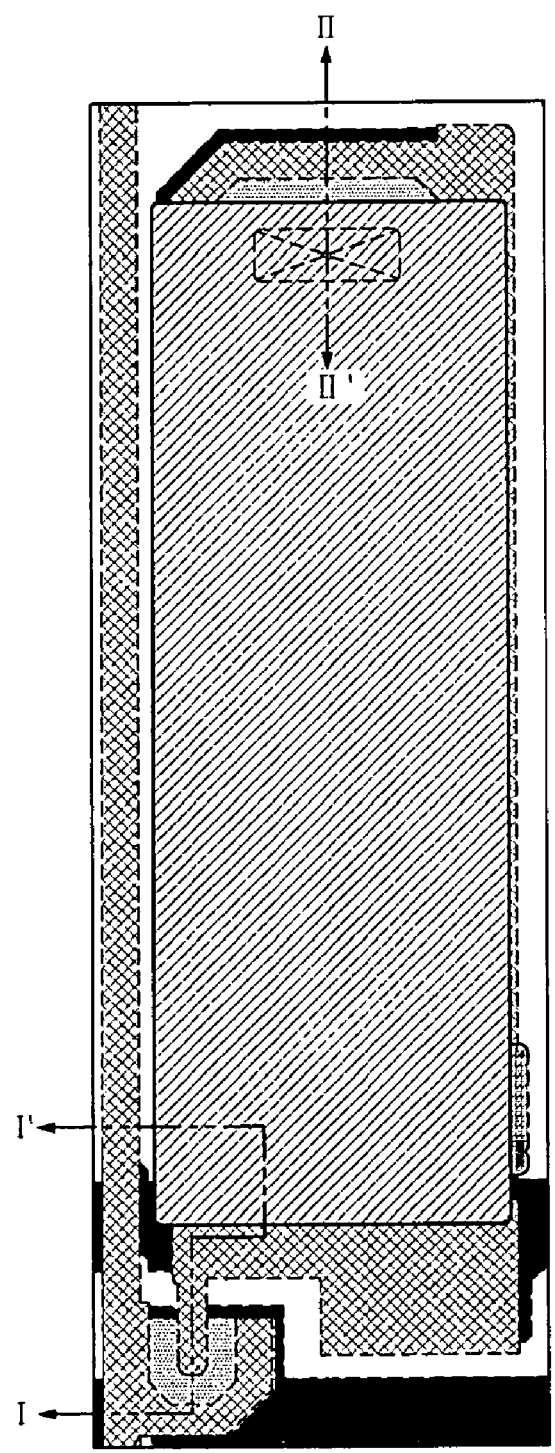
Figure 14B:
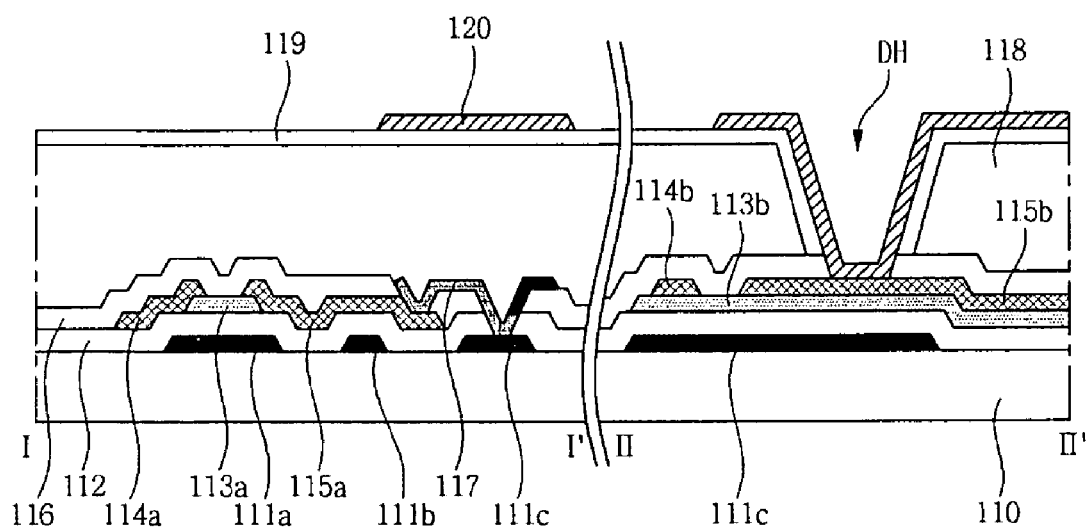

Referring to FIGS. 14a and 14b, an opaque metal having high reflection ratio such as aluminum (Al), Al-alloy, silver (Ag), Ag-alloy, molibdenium (Mo), chromium (Cr), or copper (Cu) is deposited on the overall surface having the buffer layer 119 by sputtering process. After that, using the photo-lithograph and the etching processes, the opaque metal is patterned to form cathode electrode 120. The opaque cathode electrode 120 is connected to the drain electrode 115b of the drive TFT (DRTFT) through the drain contact hole (DH).

Figure 15A:
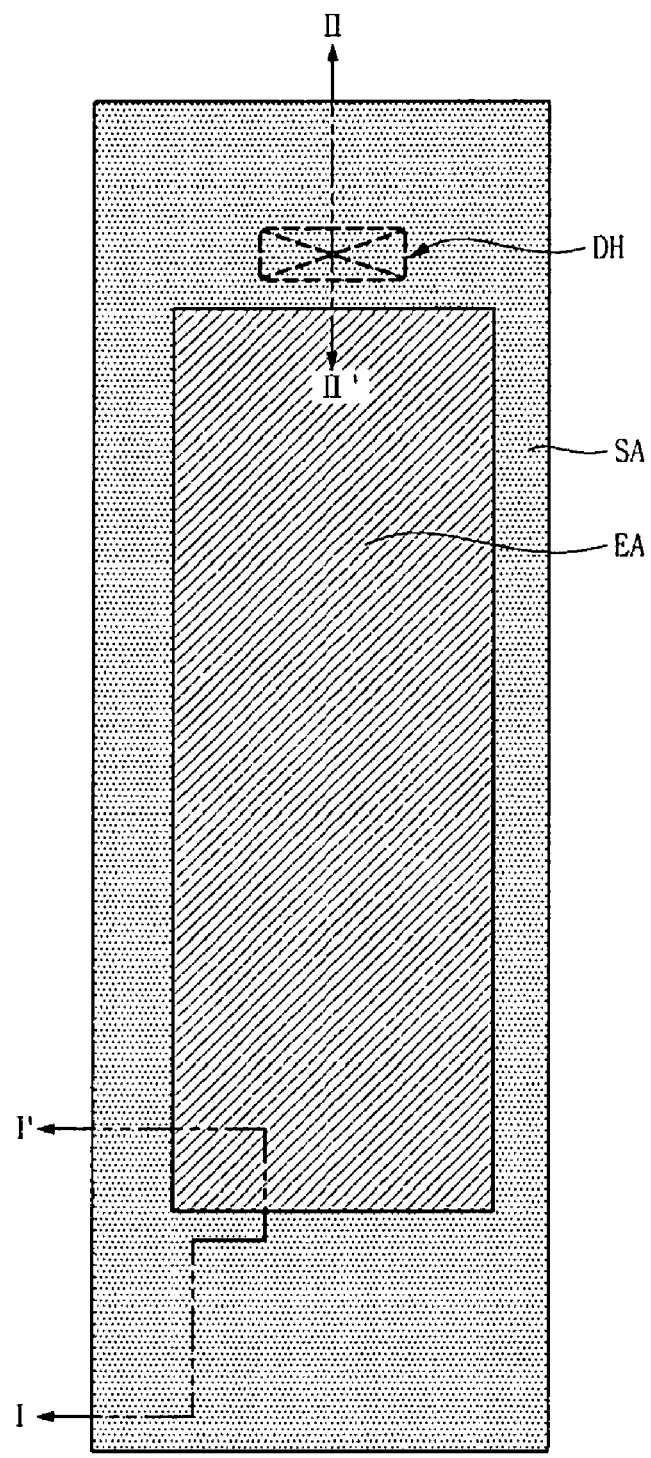
Figure 15B:
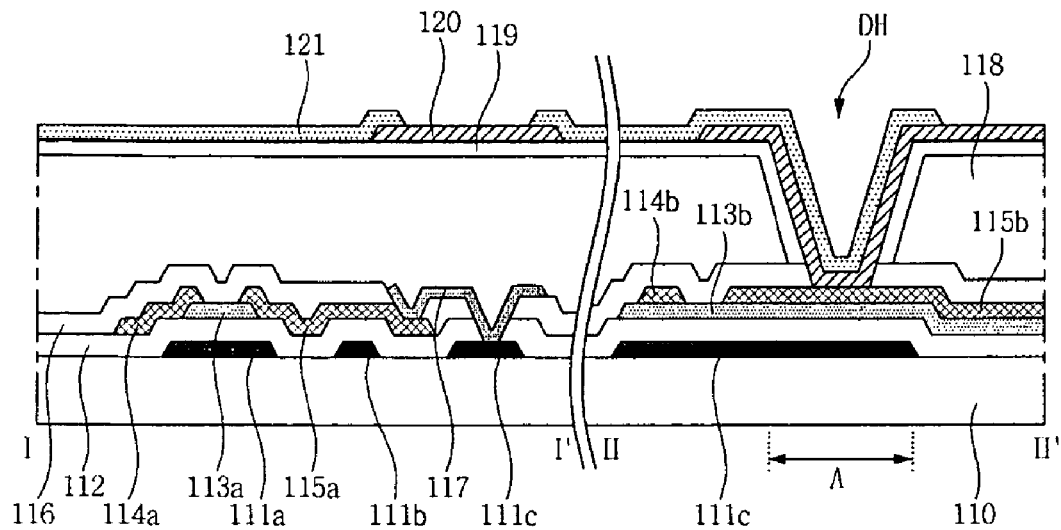

Referring to FIGS. 15a and 15b, an inorganic insulating material such as silicon oxide (SiOx) or silicon nitride (SiNx) is deposited on the overall surface of the substrate 110 having the opaque cathode electrode 120 by the CVD process. After that, using the photo-lithograph and etching processes, the inorganic insulating material is patterned to form the bank pattern 121 defining the aperture area (EA) and the non-aperture area (SA) in the pixel. The bank pattern 121 is formed to cover the non-aperture area (SA) and exposes the aperture area (EA). Especially, the bank pattern 121 at the upper side of the pixel is wider than that of the related art so that it can cover to the stepped region (A) due to the drain contact hole (DH). Therefore, the stepped region (A) due to the drain contact hole (DH) is excluded from the aperture area (EA). As a result, the defects on the display quality due to the degraded organic layer 122 at the stepped region (A) do not occur. In the interim, the bank pattern 122 may include an organic insulating material such as photoacryl or polyimide.

Figure 16:
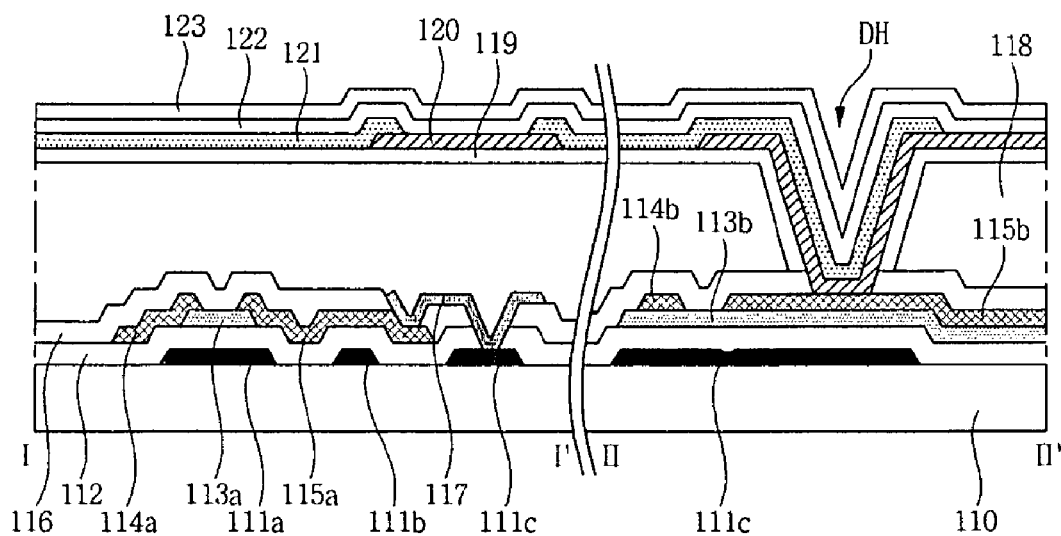

Referring to FIG. 16, sequentially depositing an electron injection layer material, an electron transport layer material, an emission layer material, an hole transport layer material, and an hole injection layer material on the overall surface of the substrate 110 having the bank pattern 121 with the thermal evaporation process, the organic layer 122 is formed. After that, using the sputtering process, an oxidation material such as IZO, ITO or tungsten oxide (Wax) is deposited on the overall surface of the substrate 110 having the organic layer 122 to form the anode electrode 123.

Figure 20:
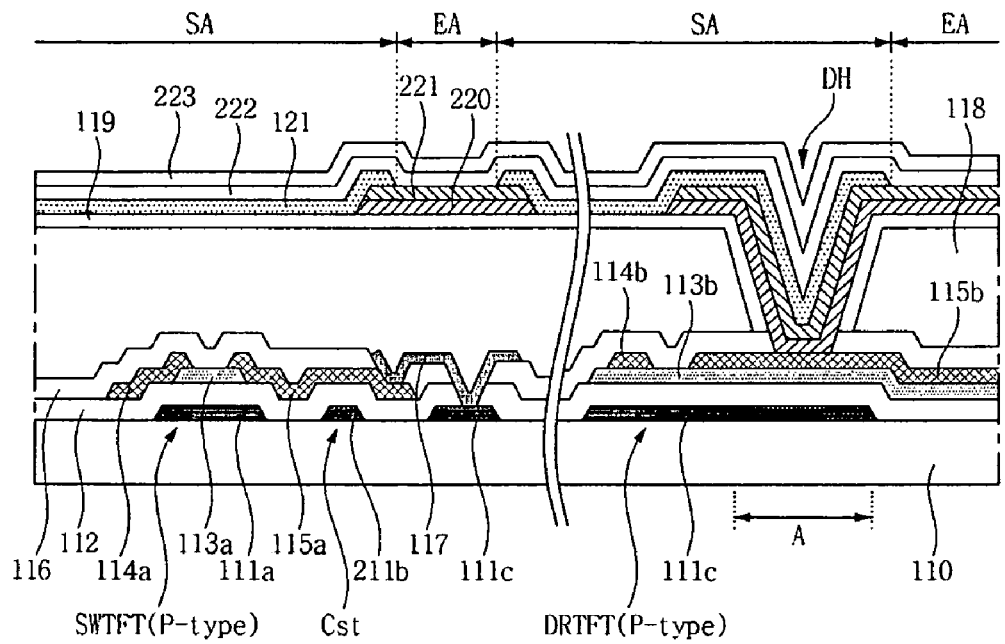
FIG. 20 is a diagram illustrating the cross-sectional structure of a pixel in the OLED display device according to the second embodiment of the present disclosure.

FIGS. 20 and 21 illustrate the normal OLED type in which a transparent cathode electrode is used for the upper electrode and a reflection electrode and a transparent anode electrode are used for the lower electrode.

FIG. 20 illustrates a cross-sectional structure of a pixel in the OLED display device according to the second embodiment of the present disclosure. FIG. 21 illustrates the equivalent circuit diagram of a pixel in the OLED display device shown in FIG. 20.

Referring to FIGS. 20 and 21, the OLED display device according to the second embodiment of the present disclosure comprises the gate line (GL), data line (DL), VDD supply line 211*b*, switch TFT (SWTFT), drive TFT (DRTFT), storage capacitor (Cst), overcoat layer 118, buffer layer 119, bank pattern 121, and OLED on the substrate 110. The OLED includes the reflection electrode 220, anode electrode 221, organic layer 222, and transparent cathode electrode 223.

The OLED display device according to the second embodiment of the present disclosure is substantially same as the OLED display device according to the first embodiment except that the TFTs (SWTFT and DRTFT) is the P-type MOSFET, the one electrode of the storage capacitor (Cst) is the VDD supply line 211*b*, the anode electrode 221 having the reflection electrode 220 is connected to the drain electrode 115*b* of the drive TFT (DRTFT) exposed through the drain contact hole (DH), and the OLED has stacked structure. Therefore, the explanation for the same portions is not mentioned.

The storage capacitor (Cst) is configured with the VDD supply line 211*b* as the one electrode, the drain electrode 115*a* of the switch TFT (SWTFT) as the other electrode, and the gate insulating layer 112 as the dielectric layer.

The anode electrode 221 having the reflection electrode 220 acting as the lower electrode of the OLED includes the oxidation material such as ITO or IZO, aluminum (Al), and silver-aluminum-neodium (Ag—AlNd), and is connected to the drain electrode 115*b* of the drive TFT (DRTFT) exposed through the drain contact hole (DH). For example, the anode electrode 221 having the reflection electrode 220 may have triple-layer structure of ITO/Ag/ITO or double-layer structure of Ag/ITO.

The organic layer 222 is formed by depositing the hole injection layer material, hole transport layer material, emission layer material, electron transport layer material, and electron injection layer material sequentially on the overall surface of the substrate. On the organic layer 222, the transparent electrode 223 acting the upper electrode of the OLED is formed in single layer or multi layer structure. The low level voltage (VSS) is supplied to the cathode electrode 223 from the VSS supply pad. When the driving voltage is supplied to the anode electrode 221 and the cathode electrode 23, the hole passing through the hole transport layer and the electron passing through the electron transport layer move to the emission layer to form the excitator. As a result, the emitting layer irradiates the visible light.

In the OLED display device according to the second embodiment of the present disclosure, the bank pattern 121 at the upper side of the pixel is wider than that of the related art so that it can cover to the stepped region (A) due to the drain contact hole (DH). Therefore, the stepped region (A) due to the drain contact hole (DH) is excluded from the aperture area (EA). As a result, the defects on the display quality due to the degraded organic layer 122 at the stepped region (A) do not occur.

While the embodiment of the present invention has been described in detail with reference to the drawings, it will be understood by those skilled in the art that the invention can be implemented in other specific forms without changing the technical spirit or essential features of the invention. The scope of the invention is defined by the appended claims rather than the detailed description of the invention. All changes or modifications or their equivalents made within the meanings and scope of the claims should be construed as falling within the scope of the invention.

What is claimed is:

1. A method for fabricating an organic light emitting diode display device comprising:
   forming a switch TFT and a drive TFT on a substrate;
   forming an overcoat layer on the TFTs;
   forming a drain contact hole exposing portions of a drain electrode of the drive TFT by removing portions of the overcoat layer;
   patterning a first electrode for connecting to the drain electrode of the drive TFT;
   patterning a bank pattern exposing an aperture area of a pixel;
   forming an organic layer on the first electrode; and forming a second electrode on the organic layer, wherein the bank pattern blocks regions where the drain contact hole is formed and the bank pattern is formed between the first electrode and the organic layer in the drain contact hole.

2. The method of the claim 1, wherein the switch TFT comprises:
   a gate electrode connecting to a gate line; and
   a first active pattern for forming a first channel between a source electrode and a drain electrode, wherein an edge of the first active pattern is located inner side from an edge of the gate electrode of the switch TFT.

3. The method of the claim 2, wherein the first channel includes at least selected one of an U-shape, an L-shape, and an I-shape.

4. The method of the claim 1, wherein the drive TFT comprises:
   a gate electrode connecting to a drain electrode of the switch TFT; and
   a second active pattern for forming a second channel between a source electrode and a drain electrode, wherein an edge of the second active pattern is located inner side from an outermost edge of the gate electrode of the drive TFT.

5. The method of the claim 4, wherein the second channel includes an "O"-shape.

6. The method of the claim 1, wherein the bank pattern includes at least selected one of an inorganic material and an organic material.

7. The method of the claim 6, wherein the bank pattern includes selected one of a silicon oxide, a silicon nitride, a photoacryl, and a polyimide.

8. The method of the claim 1, wherein the first electrode includes an opaque cathode electrode, and the second electrode includes a transparent anode electrode.

9. The method of the claim 1, wherein the first electrode includes an anode electrode having a reflection electrode, and the second electrode includes a transparent cathode electrode.

10. The method of the claim 9, wherein the first electrode includes selected one of a triple-layer structure having two transparent metals and a reflection metal therebetween, and a double-layer structure having a transparent metal and a reflection metal.

* * * * *